(12) United States Patent
Reents et al.

(10) Patent No.: US 8,784,634 B2
(45) Date of Patent: Jul. 22, 2014

(54) ELECTROLYTIC METHOD FOR FILLING HOLES AND CAVITIES WITH METALS

(75) Inventors: Bert Reents, Berlin (DE); Bernd Roelfs, Berlin (DE); Tafadzwa Magaya, Berlin (DE); Markus Youkhanis, Berlin (DE); René Wenzel, Berlin (DE); Soungsoo Kim, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 362 days.

(21) Appl. No.: 12/295,513

(22) PCT Filed: Mar. 30, 2007

(86) PCT No.: PCT/EP2007/002872
§ 371 (c)(1), (2), (4) Date: Jan. 21, 2009

(87) PCT Pub. No.: WO2007/112971
PCT Pub. Date: Oct. 11, 2007

(65) Prior Publication Data
US 2009/0301889 A1    Dec. 10, 2009

(30) Foreign Application Priority Data
Mar. 30, 2006   (EP) .................................. 06090045

(51) Int. Cl.
*C25D 21/18*   (2006.01)
*C25D 5/18*    (2006.01)
*C25D 3/38*    (2006.01)
*C25D 3/58*    (2006.01)
*H05K 3/42*    (2006.01)

(52) U.S. Cl.
CPC ....... *H05K 3/423* (2013.01); *C25D 3/38* (2013.01); *H05K 2203/1476* (2013.01); *H05K 2203/1492* (2013.01); *H05K 2201/09563* (2013.01); *C25D 5/18* (2013.01)
USPC ........... 205/101; 205/102; 205/103; 205/239; 205/291

(58) Field of Classification Search
USPC .............................. 205/96, 80, 170, 103, 291
See application file for complete search history.

(56) References Cited

U.S. PATENT DOCUMENTS 4,026,772 A * 5/1977 Ammann et al. ............. 205/575
4,496,436 A    1/1985 Inoue
4,975,159 A   12/1990 Dahms
5,433,840 A    7/1995 Dahms et al.
5,976,341 A * 11/1999 Schumacher et al. ........ 205/101
(Continued)

FOREIGN PATENT DOCUMENTS

DE    27 39 427 A1    3/1978
DE    38 36 521 C2    4/1990
(Continued)

*Primary Examiner* — James Lin
*Assistant Examiner* — Brian W Cohen
(74) *Attorney, Agent, or Firm* — Renner, Otto, Boisselle & Sklar, LLP

(57) ABSTRACT

Disclosed is an electroplating method for filling cavities, through holes, blind holes, or micro blind holes of a work piece with metals. According to said method, the work piece containing cavities, through holes, blind holes, or micro blind holes is brought in contact with a metal deposition electrolyte, and a voltage is applied between the work piece and at least one anode such that a current flow is fed to the work piece. The invention method is characterized in that the electrolyte encompasses a redox system.

25 Claims, 4 Drawing Sheets

(56) References Cited

U.S. PATENT DOCUMENTS

| | | | |
|---|---|---|---|
| 6,099,711 A | 8/2000 | Dahms et al. | |
| 6,129,830 A | 10/2000 | Senge et al. | |
| 6,238,529 B1 * | 5/2001 | Geissler et al. | 204/202 |
| 6,793,795 B1 * | 9/2004 | Meyer et al. | 205/101 |
| 7,220,347 B2 * | 5/2007 | Isono et al. | 205/118 |
| 2003/0010642 A1 * | 1/2003 | Taylor et al. | 205/103 |
| 2006/0151328 A1 | 7/2006 | Rents et al. | |

FOREIGN PATENT DOCUMENTS

| | | |
|---|---|---|
| DE | 41 26 502 C1 | 2/1993 |
| DE | 42 25 961 C2 | 2/1994 |
| DE | 195 45 231 A1 | 5/1997 |
| DE | 196 53 681 A1 | 6/1998 |
| DE | 199 15 146 C1 | 7/2000 |
| DE | 102 09 365 C1 | 2/2003 |
| DE | 103 11 575 A1 | 9/2004 |
| DE | 103 25 101 A1 | 12/2004 |
| DE | 10 2004 045 451 A1 | 3/2006 |
| EP | 0 645 950 B1 | 9/1998 |
| EP | 1 194 023 A1 | 4/2002 |
| EP | 1 219 729 A1 | 7/2002 |
| EP | 1 264 918 A1 | 12/2002 |
| WO | WO 2004081262 A1 * | 9/2004 |
| WO | WO 2004/107834 A1 | 12/2004 |
| WO | WO 2006/032346 A1 | 3/2006 |

* cited by examiner

Figure 1a: Formation of a constriction by the preferred copper plating in the center of a through hole in a circuit board
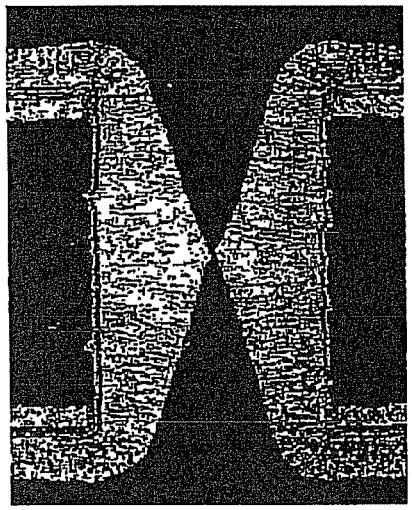
Figure 1b: Formation of a constriction by the preferred copper plating in the center of a through hole in a circuit board
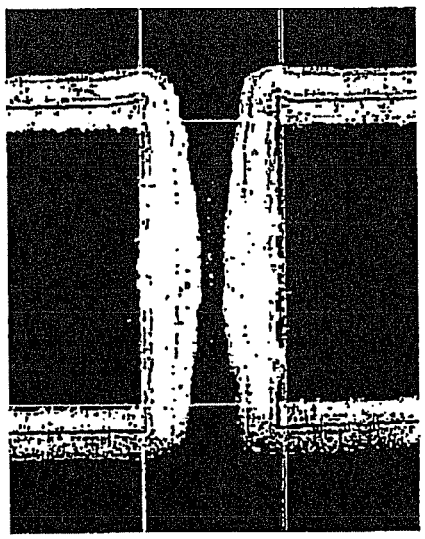

Figure 2: Filled through hole after the formation of a constriction in the center of the hole and subsequent filling thereof.
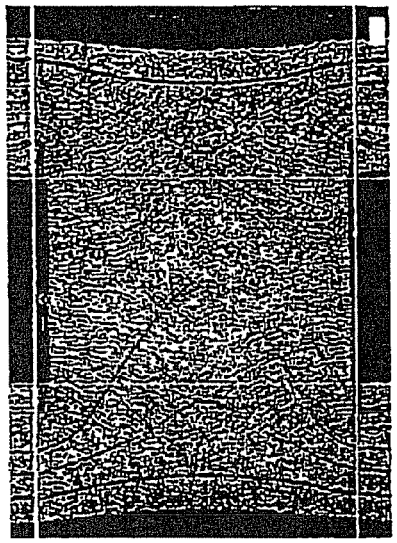
Figure 3: Pulse reverse current diagram with phase shift and pulse gap.
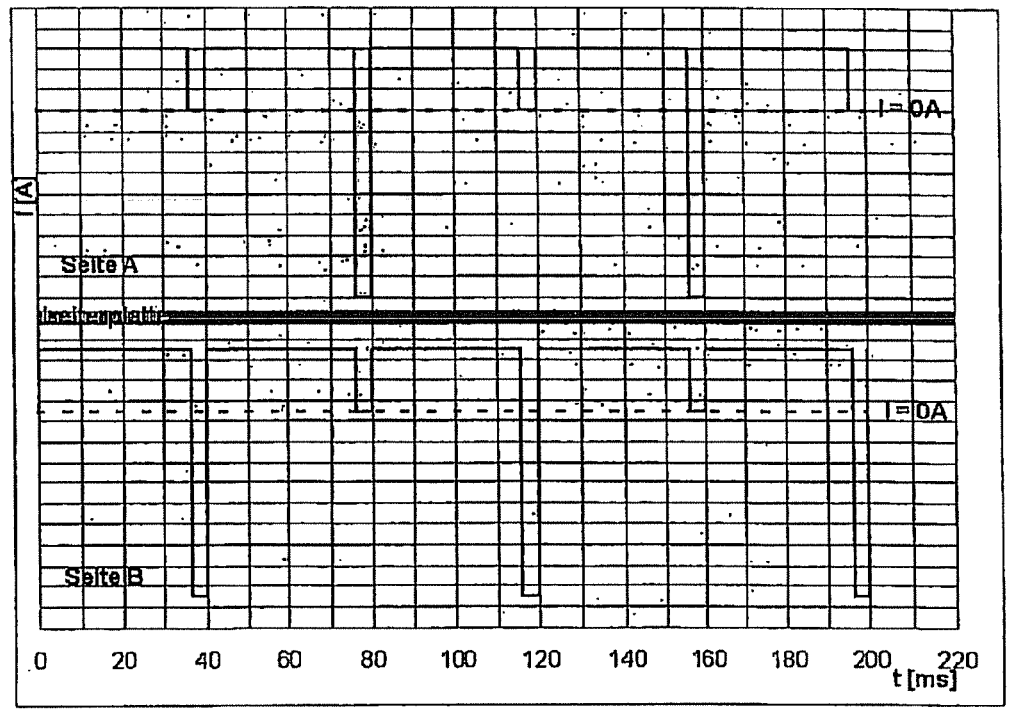

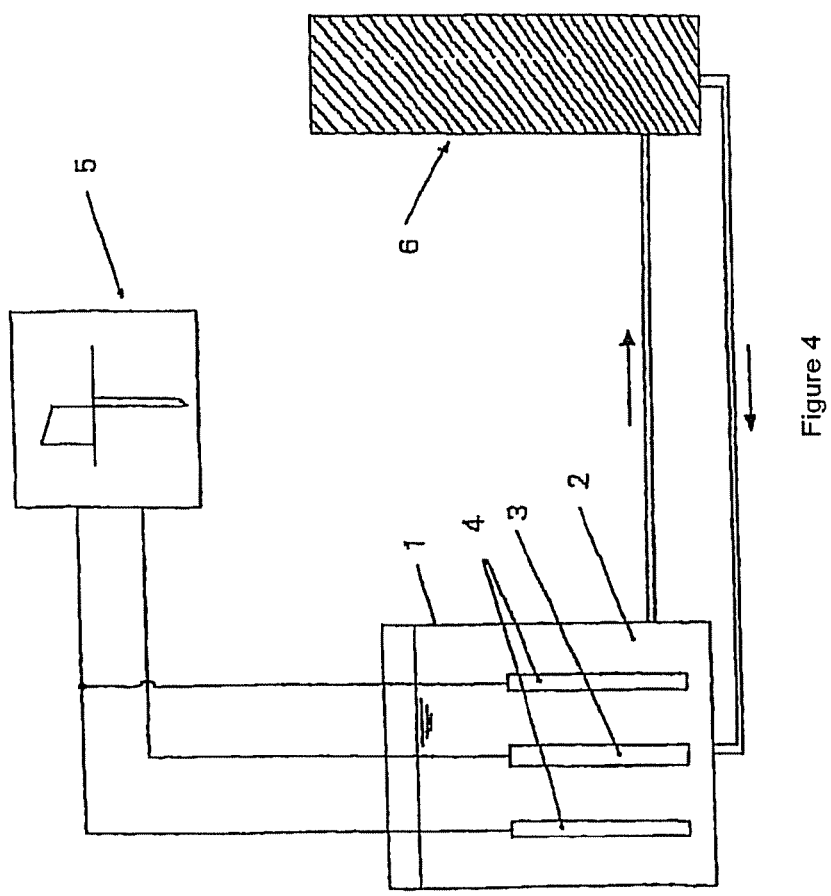
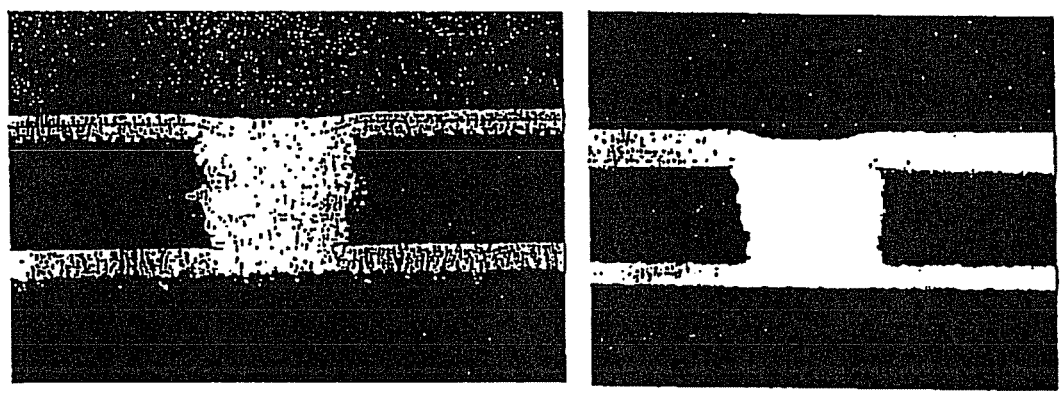
Figure 5a  5b

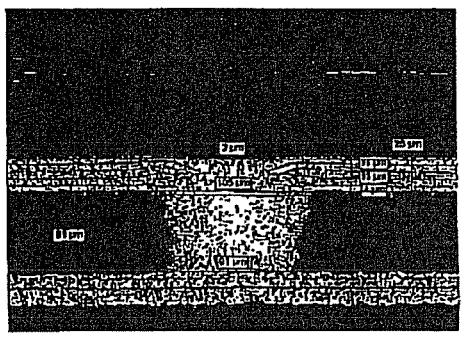
Figure 6: Blind hole 100:60 µm after the metallization with copper
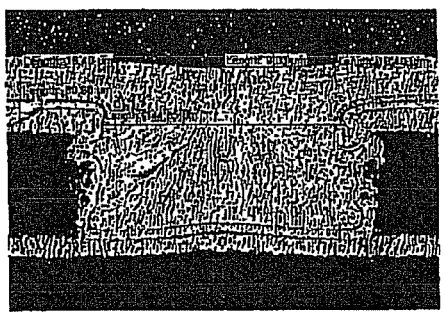
Figure 7: Blind hole 145:80 µm after the metallization with copper

ELECTROLYTIC METHOD FOR FILLING HOLES AND CAVITIES WITH METALS

FIELD OF THE INVENTION

The present invention relates to an electrolytic method for filling cavities, blind holes, micro blind wholes and through holes in substrates with metals. The method is particularly suitable for filling blind holes in circuit boards with copper. However, it is also suitable for filling other cavities with metals, in particular with copper. The method provides stable fillings also for small hole diameters and undesired inclusions in the through hole can be avoided. Furthermore, the filling exhibits an excellent thermal conductivity.

RELEVANT STATE OF THE ART

The increasing miniaturization of electronic components simultaneously leads to an increase in integration density. In case of circuit boards, the tendency towards miniaturization is reflected in the following constructional parameters: reduction in pad diameters and width of conductors/interspace between conductors as well as an improved registration and an increase in the number of layers.

Circuit boards having these properties are generally referred to as circuit boards with a high integration density (so-called High Density Interconnection or HDI).

An important aspect for such HDI circuits in the field of circuit boards is the filling of through holes (so-called via holes) as well as blind holes. Blind holes below certain dimensions are also referred to as μ-blind vias (μ-BVs). Such μ-BVs or micro blind holes serve to interconnect at least two layers in circuit boards with each other. Blind holes are referred to as μ-BVs if the hole diameter of the vias is below 0.15 mm (according to IPC) or if the hole density exceeds 1000 vias/dm$^3$. The term "blind holes" is used as a general term in the following and includes μ-BVs.

The filling of through holes or blind holes makes great demands with respect to the process control. Various kinds of drilling holes have to be taken into consideration, various requirements with respect to the filling materials have to be complied with and the subsequent processing steps for a printed circuit board have to be taken into consideration.

The present invention predominantly describes the filling of through holes in circuit boards passing through the entire board (plated through hole, PTH) and internal through connections (buried vias) as well as blind vias.

The method is generally suitable for filling through holes and blind holes in various work pieces, in particular for work pieces in board form and electric circuit supports containing through holes or blind holes.

Sealing through holes and blind holes is inter alia necessary in order to avoid passing of solder material onto the components, to achieve a high integration density and to improve the electric properties. For multilayer circuit boards inclusions (of air, solvent and the like) in the holes may occur during applying the next construction layer, the inclusions leading to bulges and, as a result, to cracks in the subsequent layer in case of later thermal strains.

Hence, the main requirements for filling materials for through holes and blind holes are
 solvent-free,
 good adhesive properties on the sleeve and on the solder stop lacquer,
 stability against process chemicals in subsequent steps (for example electrolytic metallization with nickel, gold or tin);
 durability in hot air levelling processes.

Various methods for filling through holes and blind holes are described in the state of the art.

In the simplest case the holes are filled with a specifically adjusted solder stop lacquer. The advantage of this method is that there is no negative impact on the resolution at a high integration density by the via hole filler which necessarily projects like a rivet head. However, a disadvantage is the risk of solvent inclusions which may abruptly evaporate during subsequent process steps such as tin plating to thereby crack the coating.

However, this method is not suitable for sealing through holes in interior positions. For this purpose, the interior layers have to be sealed completely in order to avoid inclusions. For this process plugging is frequently used, because this method enables the formation of an interior layer by means of a copper plating of the filled through hole, wherein the interior layer can be structured without limitation.

Various dielectrics such as for example resin coated copper foils (RCC) or photo dielectric liquid films or dry films are used as filling material.

EP 0 645 950 B1 describes a method for preparing multilayered circuit substrates. Thermosetting resins selected from the group consisting of phenolic resins and epoxy resins are used as filling material for through holes. Furthermore, at least one metal powder selected from the group consisting of silver, nickel, copper and an alloy thereof is added to the resin as a conductive substance.

In general, the plugging is carried out after drilling the circuit board and after finally metallizing the drill holes, however, prior to structuring. After filling the through connections and curing the plugging paste, the plugging paste is levelled mechanically because it exhibits a slight rivet head from the filling process. Subsequently, a metallization of the paste with copper is frequently carried out such that a continuous copper layer is formed as the top layer. On a simplified basis, the following steps are required:
 drilling
 metallizing the sleeve
 plugging
 brushing, grinding
 metallizing the plugging paste
 applying the next construction layer.

EP 1 194 023 A1 describes the preparation of HDI circuit boards by filling through holes with conductive pastes, wherein the curing of the paste can be performed simultaneously with pressing the base material, thereby generating an electric contact of the interior layers.

According to other methods, the through holes and blind holes are filled by metallizing with copper.

EP 1 264 918 A1 describes a method for electrodepositing copper, the method being particularly suitable for filling μ-blind vias. The use of inert anodes in a dummy plating phase results in maintaining and improving the filling capacity of the electrolyte.

According to EP 1 219 729 A1 chemical substances such as formaldehyde, but also oxidizing agents are used to extend the durability of the metallization bath, which is particularly suitable for filling μ-blind vias. For this purpose, sulfur-containing substances such as sulfonic acid groups as well as thiol-reactive compounds are used as additives.

DE 103 25 101 describes a method for filling μ-blind vias characterized by the following steps:
 (i) using a bath electrolyte for electrolytically applying metallic coatings comprising metal salts, acids and organic additives, wherein the bath contains an inorganic matrix comprising 15-60 g/l copper, 40-300 g/l sulfuric acid and 20-150 mg/l chloride and the organic additives comprise brighteners, wetting agents and other additives selected from polyamides, polyamines, lactam alkoxylates, thioureas, oligomeric and polymeric phenazonium derivatives and amino triphenyl methane dyes, (ii) operating the bath using direct current at a current density of 0.5-2.5 A/dm$^2$ or current pulses having an effective current density of 0.5 to 10 A/dm$^2$, (iii) withdrawing a part of the electrolyte from the electrolytic bath, (iv) adding an oxidizing agent to the withdrawn part, (v) optionally irradiating the withdrawn electrolyte with UV light and (vi) returning the withdrawn part into the electrolytic bath and replenishing the organic additives destroyed by the oxidation treatment.

In the conventional metallization of holes, for example in circuit boards, an approximately uniform spreading at the ends of the hole as well as in the center of the holes is observed initially. During the metal deposition the aspect ratio changes and the spreading within the drill hole becomes lower. This results in an increased metal deposition at the ends of the drill holes which become sealed before the interior space is metallized in a filling manner. Undesired inclusions remain in the holes, in particular residues of the metallization bath.

Furthermore, the problem occurs that not only the holes are metallized, but also the surface of the substrate is metallized. This is not desirable and significantly affects the process.

SUMMARY OF THE INVENTION

Therefore, it is the object underlying the present invention to provide a method for filling cavities, through holes and blind holes or micro blind holes, wherein the metal deposition preferably occurs in the holes and not at the surface of the substrate.

This object can surprisingly be solved by employing a redox system (i.e. for example a Fe$^{2+/3+}$-system) in the metallization bath, thereby surprisingly achieving that the metal deposition preferably occurs in the cavities, through holes as well as blind holes and micro blind holes, respectively.

In the printed circuit board technology which is a preferred field of application of the present invention, these holes are filled with metal.

DESCRIPTION OF THE FIGURES

FIGS. 1a and 1b exhibit the formation of a constriction by the preferred copper plating in the center of a through hole in a circuit board.

FIG. 2 exhibits a filled through hole after the formation of a constriction in the center of the hole and subsequent filling thereof.

FIG. 3 exhibits a pulse reverse current diagram with phase shift and pulse gap.

FIG. 4 exhibits a schematic drawing of a device which is suitable for processing work pieces in a dipping process.

FIGS. 5a and 5b exhibit the deposition of copper in a blind hole and at the surface of a circuit board from a bath having different contents of Fe(III).

FIG. 6 exhibits a blind hole 100:60 µm after metallization with copper.

FIG. 7 exhibits a blind hole 145:80 µm after metallization with copper.

DESCRIPTION OF PREFERRED EMBODIMENTS OF THE INVENTION

In a preferred embodiment of the present invention the method serves to fill through holes in circuit boards having a maximum height of 3.5 mm, a preferred height of 0.025-1 mm and a particularly preferred height of 0.05-0.5 mm as well as a diameter of 1000 µm at the most, preferably 30-300 µm and particularly preferred 60-150 µm.

In general, in the method for filling through holes of a work piece with metals according to the present invention, any electrolyte suitable for electrolytic metal deposition can be employed, such as for example electrolytes for depositing gold, tin, nickel or alloys thereof. Copper is preferably used as the metal. For example, the electrolyte may have the above-mentioned composition according to DE 103 25 101 and may additionally contain a redox system, inter alia a Fe(II)/Fe(III) system.

It has turned out that electrolytes used for depositing copper and having the following composition provide the best results:

Copper may be added to the electrolyte as copper sulfate pentahydrate (CuSO$_4$×5H$_2$O) or as a copper sulfate solution. The operating range is between 15-75 g/l copper.

Sulfuric acid (H$_2$SO$_4$) is added in the form of a 50-96% solution. The operating range is from 20-400 g/l, preferably 50-300 g/l.

Chloride is added in the form of sodium chloride (NaCl) or as a hydrochloric acid solution (HCl). The operating range of chloride in this case is between 20-200 µg/l, preferably 30-60 mg/l.

The electrolyte preferably further comprises brighteners, levelling agents and wetting agents as organic additives.

Wetting agents are usually oxygen-containing, high molecular compounds in concentrations of 0.005-20 g/l, preferably 0.01-5 g/l. Examples are listed in Table 1:

TABLE 1

| Wetting agents |
| --- |
| Carboxymethylcellulose |
| Nonylphenol polyglycol ether |
| Octandiol bis(polyalkylene glycol ether) |
| Octanol polyalkylene glycol ether |
| Oleic acid polyglycol ester |
| Polyethylene glycol polypropylene glycol copolymerisate |
| Polyethylene glycol |
| Polyethylene glycol dimethyl ether |
| Polypropylene glycol |
| Polyvinyl alcohol |
| β-Naphthol polyglycol ether |
| Stearic acid polyglycol ester |
| Stearyl alcohol polyglycol ether |

In general, sulfur-containing substances which are listed in Table 2, are used as brighteners:

TABLE 2

| Sulfur compounds |
| --- |
| 3-(Benzthiazolyl-2-thio)-propylsulfonic acid, sodium salt |
| 3-Mercaptopropane-1-sulfonic acid, sodium salt |
| Ethylenedithiodipropyl sulfonic acid, sodium salt |
| Bis-(p-sulfophenyl)disulfide, disodium salt |
| Bis-(ω-sulfobutyl)disulfide, disodium salt |
| Bis-(ω-sulfohydroxypropyl)disulfide, disodium salt |
| Bis-(ω-sulfopropyl)disulfide, disodium salt |
| Bis-(ω-sulfopropyl)sulfide, disodium salt |
| Methyl-(ω-sulfopropyl)disulfide, disodium salt |

TABLE 2-continued

Sulfur compounds

Methyl-(ω-sulfopropyl)trisulfide, disodium salt
O-Ethyl-dithiocarbonic acid-S-(ω-sulfopropyl)ester, potassium salt
Thioglycolic acid
Thiophosphoric acid-O-ethyl-bis-(ω-sulfopropyl)ester, disodium salt
Thiophosphoric acid tris-(ω-sulfopropyl)ester, trisodium salt Polymeric nitrogen compounds (such as polyamines or polyamides) or nitrogen-containing sulfur compounds such as thio-urea derivatives or lactam alkoxylates such as those described in DE 38 36 521 C2 can be used as levelling agents. The concentrations of the substances used lies in a range of 0.1-100 ppm.

Furthermore, also the polymeric phenazonium derivatives described in DE 41 26 502 C1 can be used. Further substances which are used for filling blind holes, are dyes on the basis of an amino triphenyl methane structure such as malachit green, rosalinine or crystal violet.

For example, inert anodes can be used as anodes. Also the use of soluble anodes is generally possible.

It has now turned out that the use of a redox system (i.e. for example a $Fe^{2+/3+}$-system) surprisingly leads to the metal deposition preferably occurring in the cavities, through holes and blind holes.

The use of an iron redox system is preferred. Concentrations:

Fe(II): at least 1 g/l, preferably 2-25 g/l;
Fe(III): 1-30 g/l, preferably 4-15, more preferably 5-9 g/l and particularly preferred 6-8 g/l.

A typical assembly suitable for the treatment of work pieces in dipping processes is schematically represented in FIG. 4. The deposition solution 2 containing the compounds of the electrochemically reversible redox system, for example iron(II) and iron(III) ions, is contained in container 1. For example, the deposition solution can serve for copper plating and in this case it contains the ingredients indicated above. The work pieces 3, for example circuit boards, and the anodes 4, for example titanium anodes coated with iridium oxide are submerged in the deposition solution. The work pieces and the anodes are connected to a current source 5. Instead of controlling the current by means of the current source also a voltage supply may be provided, the voltage supply being used to control the voltage between the work pieces and the anodes. The deposition solution is continuously supplied to a second container 6 by supply means (not depicted) such as pumps.

In this separate container, the metal ion generator which the deposition solution passes through, the metal in the deposition solution is replenished. In the case of copper deposition, metallic copper parts, for example in the form of pieces, spheres or pellets, are present in the metal ion generator. The copper parts are dissolved into copper ions under the influence of the oxidized form of the redox compounds. By dissolving the copper parts, the oxidized form of the redox system is transferred into its reduced form. The solution enriched with copper ions and the reduced form is returned into the first container by means of the pumps (not depicted). The metallic copper used for the regeneration does not need to contain phosphorus; however, phosphorus does not have a disturbing effect. In the conventional use of soluble copper anodes, also the composition of the anode material is of major importance: in this case the copper anodes have to contain about 0.05% by weight phosphorus. Such materials are expensive and the added phosphorus causes residues in the electrolytic cell, which have to be removed by an additional filtering step.

The sufficiently high concentration of Fe(III) ions which has not been described in the state of the art up to now, is decisive.

Also soluble anodes can be employed for acidic copper, DC and AC electrolytes.

Furthermore, it has turned out that the filling with metals particularly in horizontal methods provides particularly good results by using a specific kind of metallization by means of a pulse reverse current. This specific technique is characterized by a phase shift of 180° between the two pulse forms generated by two separated pulse rectifiers. By means of the two pulse rectifiers, the two sides of a circuit board can be metallized separately. An additional characteristic lies in the use of a periodically repeating pulse gap for both pulse rectifiers, which is selected such that the reverse current pulse acts on the other side at the same time (cf. FIG. 3).

This reverse pulse plating has been developed for the electrolytic deposition of in particular copper onto circuit boards having a high aspect ratio and is described, for example, in DE 42 25 961 C2 and DE 27 39 427 A1. By using high current densities, an improved surface distribution and spreading in the through holes is achieved.

In the method according to the present invention, the following parameters are preferably adjusted:

The ratio of the duration of the at least one forward current pulse to the duration of the at least one reverse current pulse is adjusted to at least 5, preferably to at least 15 and more preferably to at least 18. This ratio can be adjusted to up to 100 at the most and preferably to 50 at the most. The ratio is particularly preferred adjusted to about 20.

The duration of the at least one forward current pulse can be adjusted to at least 5 ms to 250 ms, preferably 20-240 ms and particularly preferred 80-160 ms.

The duration of the at least one reverse current pulse is adjusted to 20 ms at the most, preferably 1-10 ms, more preferred 1-8 ms and particularly preferred 4-5 ms.

The peak current density of the at least one forward current pulse at the work piece is preferably adjusted to a value of 15 $A/dm^2$ at the most. The peak current density of the at least one forward current pulse at the work piece preferably amounts to about 1.5-8 $A/dm^2$ in horizontal methods, particularly preferred 7-8 $A/dm^2$. In vertical methods the particularly preferred peak current density of the at least one forward current pulse at the work piece amounts to a maximum of 2 $A/dm^2$.

The peak current density of the at least one forward current pulse at the work piece is preferably adjusted to a value of 60 $A/dm^2$ at the most. The peak current density of the at least one reverse current pulse at the work piece preferably amounts to about 30-50 $A/dm^2$, particularly preferred 30-40 $A/dm^2$ in horizontal methods. In vertical methods, the particularly preferred peak current density of the at least one forward current pulse at the work piece amounts to a maximum of 3-10 $A/dm^2$.

The pulse gap generally amounts to 0-8 ms, depending on the reverse pulse parameters and the phase shift.

The phase shift amounts to 0°-180°, preferably 0° or 180°.

A modification of the method for filling cavities, through holes and blind holes of a work piece with metal comprises the following method steps:
(i) bringing into contact the work piece having through holes with a metal deposition electrolyte and applying a voltage between the work piece and at least one anode such that a current flow is fed to the work piece, wherein the current flow is selected such that a preferred deposition in the center of the through holes occurs according to FIGS. 1a and 1b and, as a result, the through holes grow together completely or almost completely;

(ii) further bringing into contact the work piece with a metal deposition electrolyte and applying a voltage between the work piece and at least one anode such that a current flow is fed to the work piece, wherein the through holes which have been obtained according to step (i) and which have been separated completely or almost completely into two halves, are filled with the metal according to FIG. 2 to the desired extent.

By applying the two step method according to the present invention it becomes possible for the first time to fill a through hole with a pure metal layer. The methods for filling described in the art use pastes—most frequently conductive pastes—because up to now it has been assumed that the production of a compact metal layer having the required durability and the desired properties is not possible.

In a preferred embodiment of the present invention, the method comprises the following method steps:

a. A first voltage is applied between a first side of the work piece and at least one anode such that a first pulse reverse current is fed to the first side of the work piece, wherein at least one first forward current pulse and at least one first reverse current pulse flow in each cycle of said first pulse reverse current.

b. A second voltage is applied between the second side of the work piece and at least one second anode such that a second pulse reverse current is fed to the second side of the work piece, wherein at least one second forward current pulse and at least one second reverse current pulse flow in each cycle of said second pulse reverse current.

c. Thereby, the work piece is in contact with an electrolyte which contains a redox system (i.e., for example $Fe^{2+/3+*}$ system).

The use of an iron redox system is preferred. Concentrations: Fe(II): at least 1 g/l, preferably 2-25 g/l.

Fe(III): 1-30 g/l, preferably 4-15, more preferably 5-9 g/l and particularly preferred 6-8 g/l.

Concerning the latter embodiment, the at least one first forward current pulse and the at least one first reverse current pulse can be shifted with respect to the at least one second forward current pulse and the at least one second reverse current pulse, respectively. In a further preferred embodiment of the present invention, said shift between the first and the second current pulse amounts to about 180°.

For further improving the spreading, the current flow in each cycle may comprise two forward current pulses, wherein a zero current gap is provided between the two forward current pulses and a reverse current pulse.

In the further course of the metallization process at least one parameter of the pulse reverse current can be varied, wherein this parameter is selected from a group comprising the ratio of the duration of the forward current pulse to the duration of the reverse current pulse and the ratio of the peak current density of the forward current pulse to the peak current density of the reverse current pulse. In particular, it has turned out to be advantageous to increase the ratio of the peak current density of the forward current pulse to the peak current density of the reverse current pulse during metallizing the work piece and/or to lower the ratio of the duration of the forward current pulse to the duration of the reverse current pulse.

The present invention is explained in more details by the following examples:

EXAMPLE 1

According to the general implementation procedure for horizontal methods described above, the circuit board is initially treated for 30 minutes in a bath for the electrolytic metallization with copper with the Inpulse H6 method and a pulse reverse current method with the parameters according to Table 1a. A deposition of copper in the through holes as shown in FIG. 1a is obtained.

Thereafter, the circuit board is treated for further 30 minutes in a second bath for the electrolytic metallization with copper with the Inpulse HF method and a pulse reverse current method having the parameters according to Table 1b. A deposition of copper in the through holes as shown in FIG. 2 is obtained.

After that the through holes are filled completely. Inclusions are not observed.

TABLE 1

Pulse parameters used for the metallization with copper

| Experiment | $I_{forward}/I_{reverse}$ in A/dm² | Pulse parameters in ms forward/reverse pulse | Pulse gap in ms | Phase shift in ° | Copper g/l | Sulfuric acid g/l |
|---|---|---|---|---|---|---|
| 1a | 6/40 | 108/6 | 6 | 180 | 40 | 200 |
| 1b | 6/40 | 72/4 | 4 | 180 | 60 | 150 |

EXAMPLE 2

According to the general implementation procedure for horizontal methods described above, a circuit board is initially treated for 30 minutes in a bath for the electrolytic metallization with copper with the Inpulse H6 method and a pulse reverse current method with the parameters according to Table 2a.

Thereafter, the circuit board is treated for further 30 minutes in a second bath for the electrolytic metallization with copper with the Inpulse HF method and a pulse reverse current method with the parameters according to Table 2b.

Thereafter, the through holes are completely filled. Inclusions are not observed.

TABLE 2

Pulse parameters used for the metallization with copper

| Experiment | $I_{forward}/I_{reverse}$ in A/dm² | Pulse parameters in ms forward/reverse pulse | Pulse gap in ms | Phase shift in ° | Copper g/l | Sulfuric acid g/l |
|---|---|---|---|---|---|---|
| 2a | 6/40 | 216/12 | 12 | 180 | 40 | 200 |
| 2b | 6/40 | 72/4 | 4 | 180 | 60 | 150 |

EXAMPLE 3

According to the general implementation procedure for horizontal methods described above, the circuit board is treated for 60 minutes in a bath for the electrolytic metallization with copper with the Inpulse HF method and a pulse reverse current method with the parameters according to Table 3.

Thereafter, the through holes are completely filled. Inclusions are not observed.

TABLE 3

Pulse parameters used for the metallization with copper

| Experiment | $I_{forward}/I_{reverse}$ in A/dm$^2$ | Pulse parameters in ms forward/reverse pulse | Pulse gap in ms | Phase shift in ° | Copper g/l | Sulfuric acid g/l |
|---|---|---|---|---|---|---|
| 3 | 6/40 | 72/4 | 4 | 180 | 60 | 150 |

EXAMPLE 4

According to the general implementation procedure for horizontal methods described above, a circuit board having a through hole diameter of 200 μm and a height of 300 μm is initially treated for 30 minutes in a bath for the electrolytic metallization with copper with the Inpulse H6 method and a pulse reverse current method with the parameters according to Table 4a.

Thereafter, the circuit board is treated for further 30 minutes in a second bath for the electrolytic metallization with copper with the Inpulse HF method and a pulse reverse current method with the parameters according to Table 4b.

Thereafter, the trough holes are completely filled. Inclusions are not observed.

TABLE 4

Pulse parameters used for the metallization with copper

| Experiment | $I_{forward}/I_{reverse}$ in A/dm$^2$ | Pulse parameters in ms forward/reverse pulse | Pulse gap in ms | Phase shift in ° | Copper g/l | Sulfuric acid g/l |
|---|---|---|---|---|---|---|
| 4a | 6/40 | 108/6 | 6 | 180 | 40 | 200 |
| 4b | 6/40 | 72/4 | 4 | 180 | 60 | 150 |

In each experiment a pulse gap and a phase shift of 180° C. were adjusted at the pulse parameter. This means that the reverse pulse was applied at the anodes at one side of the test board and that the pulse gap was applied at the anodes of the other side. The schematic presentation of the pulse form in FIG. 3 (current as a function of the time) shows the adjustment with a phase shift between the upper and the lower anodes (upper curve: current at the upper side of the cathode; lower curve: current at the lower side of the cathode).

Vertical Metallization Methods

For vertical metallization a circuit board made of FR4 material having the dimension 18"×24"=457 mm×610 mm and having a through hole diameter of 150 μm and a height of 200 μm is used.

Prior to the metallization the surface of the circuit board is initially cleaned for three minutes with an acidic cleaner S from the company Atotech Deutschland GmbH and then treated with 5% sulfuric acid for 60 seconds.

The used electrolytes have the following composition. The concentration of copper ions and sulfuric acid is separately indicated in the experiments. In each case the metallization proceeds at a temperature of 23° C.

copper sulfate
sulfuric acid
chloride ions: 60 mg/l in the first step, 35 mg/l in the second step
levelling agent Cuprapulse XP7; 20 ml/l; brightener Cuprapulse S3: 1 ml/l
levelling agent Inplate DI: 15 ml/l; brightener DI: 0.5 ml/l
Cuprapulse and Inplate levelling agents and brighteners are products of Atotech Deutschland GmbH.

A redox system having the following composition is used in the second step only:
iron(II): 5 g/l
iron(III): 1 g/l

EXAMPLE 5

According to the general implementation procedure for vertical methods described above, the circuit board is initially treated for 90 minutes in a bath for the electrolytic metallization with copper with the Cuprapulse XP7 method and a pulse reverse current method with the parameters according to Table 5a. Thereafter, the circuit board is treated in a second step for further 85 minutes in a bath for the electrolytic metallization with copper with the Inplate DI method and a direct current with the parameters according to Table 5b. Thereafter, the through holes are filled completely. Inclusions are not observed.

TABLE 5

Pulse parameters used for the metallization with copper

| Experiment | $I_{forward}/I_{reverse}$ in A/dm$^2$ | Pulse parameters in ms forward/reverse pulse | Pulse gap in ms | Phase shift in ° | Copper g/l | Sulfuric acid g/l |
|---|---|---|---|---|---|---|
| 5a | 2/8 | 20/1 | — | 0 | 17 | 260 |
| 5b | 1:5 DC | DC | — | — | 40 | 140 |

EXAMPLE 6

According to the general implementation procedure for vertical methods described above, the printed circuit board is initially treated for 90 minutes in a bath for the electrolytic metallization with copper with the Cuprapulse XP7 method and a pulse reverse current method with the parameters according to Table 6a. Thereafter, the circuit board is treated in a second step for further 85 minutes in a bath for the electrolytic metallization with copper with the Inplate DI method and a direct current with the parameters according to Table 6b. Then the through holes are completely filled. Inclusions are not observed.

TABLE 6

Pulse parameters used for the metallization with copper

| Experiment | $I_{forward}/I_{reverse}$ in A/dm$^2$ | Pulse parameters in ms forward/reverse pulse | Pulse gap in ms | Phase shift in ° | Copper g/l | Sulfuric acid g/l |
|---|---|---|---|---|---|---|
| 6a | 2/8 | 40/2 | — | 0 | 17 | 260 |
| 6b | 1:5 DC | DC | — | — | 40 | 140 |

EXAMPLE 7

According to the general implementation procedure for vertical methods described above, the printed circuit board is initially treated for 90 minutes in a bath for the electrolytic metallization with copper with the Cuprapulse XP7 method and a pulse reverse current method with the parameters according to Table 7a. Thereafter, the circuit board is treated in a second step for further 85 minutes in a bath for the electrolytic metallization with copper with the Inplate DI method and a direct current with the parameters according to Table 7b. Then the through holes are completely filled. Inclusions are not observed.

TABLE 7

Pulse parameters used for the metallization with copper

| Experiment | $I_{forward}/I_{reverse}$ in A/dm² | Pulse parameters in ms forward/reverse pulse | Pulse gap in ms | Phase shift in ° | Copper g/l | Sulfuric acid g/l |
|---|---|---|---|---|---|---|
| 7a | 1.5/6 | 20/1 | — | 0 | 17 | 260 |
| 7b | 1:5 DC | DC | — | — | 40 | 140 |

EXAMPLE 8

Implementation Procedure for Horizontal Metallization Methods

The used Inpulse 2 modules from Atotech Deutschland GmbH for the horizontal treatment of circuit boards (in which boards are conveyed for the treatment on a horizontal path and in a horizontal transport level) have a distance of 15 mm between the spray nozzle assembly and the cathode (work piece) and a distance of 8 mm between the anode and the cathode.

For the metallization a circuit board made of FR4 material having the dimensions 18"×24"=457 mm×610 mm and a blind hole diameter of 100 μm as well as a blind hole depth of 70 μm (Tables 12 and 13, third line from the top in each case) is used if not specified otherwise.

Prior to the metallization the surface of the circuit board is initially cleaned for 45 seconds with the cleaner Cuprapro CF from the company Atotech Deutschland GmbH and then treated with 5% sulfuric acid for 45 seconds.

The electrolytes used have the following composition. The metallization proceeds at a temperature of 40° C. in each case.

copper: 70 g/l sulfuric acid: 80 g/l chloride ions: 40 mg/l iron(II): 12 g/l iron(III): 2-8 g/l leveling agent Inpulse 2HF: 18 ml/l; brightener Inpulse 2: 12 ml/l Inpulse leveling agents and brighteners are products of Atotech Deutschland GmbH.

According to the general implementation procedure for horizontal methods described above, the circuit board is treated for a period specified in Tables 12 and 13 in a bath for the electrolytic metallization with copper with the Inpulse 2HF method and a pulse reverse current method with the parameters according to Table 10a. A deposition of copper in the through holes is obtained as shown in FIG. 5a.

In this second experiment, an identical circuit board is treated in a bath for the electrolytic metallization with copper with the Inpulse 2HF method and a pulse reverse current method with the parameters according to Table 10b, i.e., in this case with a significantly lower Fe(III) content of 3 g/l instead of 7 g/l. A deposition of copper in the blind hole and at the surface is obtained according to FIG. 5b.

TABLE 10

Pulse parameters used for the metallization with copper

| Experiment | $I_{forward}/I_{reverse}$ in A/dm² | Pulse parameters in ms forward/reverse pulse | Pulse gap in ms | Phase shift in ° | Copper g/l | Fe(III) g/l | Sulfuric acid g/l |
|---|---|---|---|---|---|---|---|
| 10a | 5/40 | 80/4 | 4 | 0 | 70 | 7 | 80 |
| 10b | 5/40 | 80/4 | 4 | 0 | 70 | 3 | 80 |

The minor deposition of copper at the surface (lower layer thickness of copper) in FIG. 5a due to the higher concentration of iron(III) ions in the solution compared to FIG. 5b can clearly be seen. This difference is reflected in Tables 12 and 13 for different blind hole dimensions (cf. column deposited amount):

TABLE 12

Filling of blind holes by means of the Inpulse 2HF method at a low Fe(III) content (3 g/l)

| Blind hole diameter | Depth of the blind holes | Deposition period | Deposited amount | Remaining cavity |
|---|---|---|---|---|
| 80 μm | 60 μm | 26 min. | 20 μm | <10 μm |
| 100 μm | 70 μm | 30 min. | 23 μm | <10 μm |
| 125 μm | 70 μm | 35 min. | 27 μm | <10 μm |
| 100 μm | 100 μm | 41 min. | 32 μm | <10 μm |

TABLE 13

Filling of blind holes by means of the Inpulse 2HF method at a high Fe(III) content (7 g/l)

| Blind hole diameter | Depth of the blind holes | Deposition period | Deposited amount | Remaining cavity |
|---|---|---|---|---|
| 80 μm | 60 μm | 22 min. | 12 μm | <10 μm |
| 100 μm | 70 μm | 27 min. | 15 μm | <10 μm |

TABLE 13-continued

Filling of blind holes by means of the Inpulse
2HF method at a high Fe(III) content (7 g/l)

| Blind hole diameter | Depth of the blind holes | Deposition period | Deposited amount | Remaining cavity |
|---|---|---|---|---|
| 125 µm | 70 µm | 30 min. | 17 µm | <10 µm |
| 100 µm | 100 µm | 36 min. | 20 µm | <10 µm |

EXAMPLE 9

According to the general implementation procedure for horizontal methods described above, the printed circuit board is treated for 30 minutes in a bath for the electrolytic metallization with copper with the Inpulse 2HF method and a pulse reverse current method with the parameters according to Table 14. A deposition of copper in the blind holes as shown in FIG. 6 is obtained. The blind holes are completely filled with a remaining dimple of ≤10 µm. Inclusions are not observed. The initial dimensions of the blind holes were a diameter of 100 µm and a depth of 60 µm.

TABLE 14

Pulse parameters for the metallization with copper

| Experiment | $I_{forward}/I_{reverse}$ in A/dm² | Pulse parameters in ms forward/reverse pulse | Pulse gap in ms | Phase shift in ° | Copper g/l | Sulfuric acid g/l |
|---|---|---|---|---|---|---|
| 1 | 7.9/30 | 80/4 | 0 | 0 | 70 | 70 |

EXAMPLE 10

According to the general implementation procedure for horizontal methods described above, the circuit board is treated for 50 minutes in a bath for the electrolytic metallization with copper with the Inpulse 2HF method and a pulse reverse current method with the parameters according to Table 15. A deposition of copper in the blind holes as shown in FIG. 7 is obtained. The blind holes are completely filled with a remaining dimple of ≤10 µm. Inclusions are not observed. The initial dimension of the blind holes were a diameter of 145 µm and a depth of 80 µm.

TABLE 15

Pulse parameters for the metallization with copper

| Experiment | $I_{forward}/I_{reverse}$ in A/dm² | Pulse parameters in ms forward/reverse pulse | Pulse gap in ms | Phase shift in ° | Copper g/l | Sulfuric acid g/l |
|---|---|---|---|---|---|---|
| 1 | 7.4/40 | 80/4 | 0 | 0 | 70 | 70 |

The invention claimed is:

1. A galvanic method for filling cavities, blind holes or micro blind holes of a work piece with metals, comprising
bringing into contact the work piece containing cavities, blind holes or micro blind holes with a metal deposition electrolyte and
applying a voltage between the work piece and at least one anode such that a current flow is fed to the work piece, and
wherein the electrolyte contains a Fe(II)/Fe(III) redox system and the Fe(II) ion concentration is contained at at least 1 g/l and the Fe(III) ion concentration is contained at 7-30 g/l, and wherein the metal deposition predominantly occurs in the cavities, blind holes or micro blind holes, rather than at the surface of the work piece;
wherein a first voltage is applied between a first side of the work piece and at least one first anode such that a first pulse reverse current is fed to the first side of the work piece, wherein at least one first forward current pulse and at least one first reverse current pulse flow in each cycle of said first pulse reverse current, a second voltage is applied between a second side of the work piece and at least one second anode such that a second pulse reverse current is fed to the second side of the work piece, wherein at least one second forward current pulse and at least one second reverse current pulse flow in each cycle of said second pulse reverse current.

2. A method according to claim 1, wherein the Fe(II) ion concentration is contained at 2-25 g/l and the Fe(III) ion concentration is contained at 7-15 g/l.

3. A method according to claim 2, wherein the Fe(III) ion concentration is contained at 7-9 g/l.

4. A method according to claim 1, wherein the electrolyte contains 15-75 g/l copper, 50-300 g/l $H_2SO_4$ and 20-200 mg/l chloride.

5. A method according to claim 1, wherein the Fe(III) ion concentration is contained at 7-8 g/l.

6. A method according to claim 1, wherein the cavities, blind holes or micro blind holes have a maximum height of 3.5 mm.

7. A method according to claim 1, wherein the cavities, blind holes or micro blind holes have a maximum diameter of 1000 µm.

8. A method according to claim 1, wherein the work piece is a circuit board or another electric circuit support in board form.

9. A method according to claim 1, wherein the cavities, blind holes or micro blind holes have a height of 0.05 mm-0.5 mm.

10. A method according to claim 1, wherein the cavities, blind holes or micro blind holes have a diameter of 60 µm-150 µm.

11. A method according to claim 1 wherein the Fe(II) ion concentration is 2-25 g/l, the Fe(III) ion concentration is contained at 7-15 g/l, and the electrolyte further contains 15-75 g/l copper, 50-300 g/l $H_2SO_4$ and 20-200 mg/l chloride, and wherein the cavities, blind holes or micro blind holes have a maximum height of 3.5 mm and a maximum diameter of 1000 µm.

12. A galvanic method for filling cavities, through holes, blind holes or micro blind holes of a work piece with metals, comprising
bringing into contact the work piece containing cavities, through holes, blind holes or micro blind holes with a metal deposition electrolyte and
applying a voltage between the work piece and at least one anode such that a current flow is fed to the work piece and a metal deposition completely fills the cavities, through holes, blind holes or micro blind holes, and
wherein the electrolyte contains a Fe(II)/Fe(III) redox system and the Fe(II) ion concentration is contained at at least 1 g/l and the Fe(III) ion concentration is contained at 7-30 g/l, and wherein the metal deposition predominantly occurs in the cavities, through holes, blind holes or micro blind holes, rather than at the surface of the work piece, wherein a first voltage is applied between a first side of the work piece and at least one first anode such that a first pulse reverse current is fed to the first side of the work piece, wherein at least one first forward current pulse and at least one first reverse current pulse flow in each cycle of said first pulse reverse current, a second voltage is applied between a second side of the work piece and at least one second anode such that a second pulse reverse current is fed to the second side of the work piece, wherein at least one second forward current pulse and at least one second reverse current pulse flow in each cycle of said second pulse reverse current.

13. A method according to claim 12, wherein the electrolyte contains 15-75 g/l copper, 50-300 g/l $H_2SO_4$ and 20-200 mg/l chloride.

14. A method according to claim 12, wherein the current flow in a first step (i) is selected such that a preferred deposition occurs in the center of the through holes and as a result the through holes grow together completely or almost completely, and in a further step (ii) further bringing into contact the work piece with a metal deposition electrolyte and applying a voltage between the work piece and at least one anode is carried out such that a current flow is fed to the work piece, wherein the through holes obtained according to step (i), which are completely or almost completely separated into two halves, are filled by the metal, wherein the current flow according to step (i) is a pulse reverse current and at least one forward current pulse and at least one reverse current pulse occurs in each current cycle and that the current flow according to step (ii) is either a pulse reverse current, a direct current or an alternating current, and wherein in step (i) the ratio of the duration of the at least one forward current pulse to the duration of the at least one reverse current pulse is adjusted to 5-75, the duration of the at least one forward current pulse is adjusted to 5-250 ms and the duration of the at least one reverse current pulse is adjusted to 20 ms at the most;

wherein during the carrying out of step (i), the ratio of the peak current density of the forward current pulse to the peak current density of the reverse current pulse is increased or during the carrying out of step (i), the ratio of the duration of the forward current pulse to the duration of the reverse current pulse is lowered.

15. A method according to claim 12, wherein the first current pulse is shifted with respect to the second current pulse by about 180°.

16. A method according to claim 12, wherein the current flow in a first step (i) is selected such that a preferred deposition occurs in the center of the through holes and as a result the through holes grow together completely or almost completely, and in a further step (ii) further bringing into contact the work piece with a metal deposition electrolyte and applying a voltage between the work piece and at least one anode is carried out such that a current flow is fed to the work piece, wherein the through holes obtained according to step (i), which are completely or almost completely separated into two halves, are filled by the metal, wherein the current flow according to step (i) is a pulse reverse current and at least one forward current pulse and at least one reverse current pulse occurs in each current cycle and that the current flow according to step (ii) is either a pulse reverse current, a direct current or an alternating current, and wherein in step (i) the ratio of the duration of the at least one forward current pulse to the duration of the at least one reverse current pulse is adjusted to 5-75, the duration of the at least one forward current pulse is adjusted to 5-250 ms and the duration of the at least one reverse current pulse is adjusted to 20 ms at the most.

17. A method according to claim 16, wherein the metallization steps (i) and (ii) are carried out in the same electrolyte.

18. A method according to claim 16, wherein the ratio of the duration of the at least one forward current pulse to the duration of the at least one reverse current pulse is adjusted to about 20.

19. A method according to claim 16, wherein the duration of the at least one reverse current pulse is adjusted to 1-10 ms.

20. A method according to claim 16, wherein the peak current density of the at least one forward current pulse at the work piece is adjusted to a maximum of 15 A/dm².

21. A method according to claim 16, wherein the peak current density of the at least one reverse current pulse at the work piece is adjusted to a maximum of 60 A/dm².

22. A method according to claim 16, wherein the peak current density of the at least one forward current pulse at the work piece is adjusted to a maximum of 1.5-8 A/dm² in horizontal methods and to a maximum of 2 A/dm² in vertical methods.

23. A method according to claim 16, wherein the peak current density of the at least one reverse current pulse at the work piece is adjusted to a maximum of 30-50 A/dm² in horizontal methods and to a maximum of 3-10 A/dm² in vertical methods.

24. A method according to claim 16 wherein during the carrying out of step (i), the ratio of the peak current density of the forward current pulse to the peak current density of the reverse current pulse is increased.

25. A method according to claim 16 wherein during the carrying out of step (i), the ratio of the duration of the forward current pulse to the duration of the reverse current pulse is lowered.

\* \* \* \* \*